(12) United States Patent
Elmufdi

(10) Patent No.: US 9,852,807 B1
(45) Date of Patent: Dec. 26, 2017

(54) CONTENT ADDRESSABLE MEMORY IN AN EMULATION SYSTEM

(71) Applicant: CADENCE DESIGN SYSTEMS, INC., San Jose, CA (US)

(72) Inventor: Beshara Elmufdi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 87 days.

(21) Appl. No.: 14/972,690

(22) Filed: Dec. 17, 2015

(51) Int. Cl.
    *G06F 13/10* (2006.01)
    *G11C 29/38* (2006.01)
    *G11C 29/36* (2006.01)

(52) U.S. Cl.
    CPC .............. *G11C 29/38* (2013.01); *G11C 29/36* (2013.01)

(58) Field of Classification Search
None
See application file for complete search history.

(56) References Cited

U.S. PATENT DOCUMENTS

| | | | | |
|---|---|---|---|---|
| 6,336,113 B1 * | 1/2002 | Yoneda | ................... | G11C 15/00 |
| 7,193,877 B1 * | 3/2007 | Yelluru | ................... | G11C 15/00 365/201 |
| 2006/0248095 A1 * | 11/2006 | Cozzani | ................... | H04L 45/00 |
| 2014/0278329 A1 * | 9/2014 | Selvidge | ............ | G06F 17/5027 703/15 |
| 2015/0295825 A1 * | 10/2015 | Wang | ................... | H04L 12/6418 370/392 |

* cited by examiner

Primary Examiner — Duc Doan
(74) Attorney, Agent, or Firm — Eric L. Sophir; Dentons US LLP

(57) ABSTRACT

Disclosed herein are components of an emulation system capable of efficiently recreating the functionality a CAM/TCAM memory circuit. Rather than using specialized gates or the existing processors, the embodiments described herein configure/instruct the existing memory circuits of the emulation system to imitate a search engine function that queries the existing RAM circuits, portions of which are reconfigured to function as CAM/TCAM memory. The hardware-based search engine and the repurposed memory (e.g., RAM, SRAM, DRAM) allow an emulation system to emulate the functionality of a CAM/TCAM memory. This can be implemented at a low processing cost to the emulation system, as it provides the ability to store more CAM/TCAM data at a very low cost. It can also use the existing system and emulation buses that other components (e.g., processors) of the system use to communicate with the memory, so expansion of the emulation system may not be required.

20 Claims, 4 Drawing Sheets

TCAM Bit-Matching Table 312

| X | z (don't care) | z (don't care) | 0 | 1 | 1 | 0 | 1 |
|---|---|---|---|---|---|---|---|
| Y | | | 0 | 1 | 1 | 1 | 0 |
| MASK | | | 0 | 1 | 1 | 1 | 1 |
| MATCH ON | Always | Always | Always | Never | PATTERN = 1 | PATTERN = 1 | PATTERN = 0 |

*FIG. 3B*

CONTENT ADDRESSABLE MEMORY IN AN EMULATION SYSTEM

TECHNICAL FIELD

This application relates generally to integrated circuit design and testing systems, methods, and products; sometimes referred to as electrical design emulation.

BACKGROUND

Emulation systems may comprise hardware components, such as emulation chips and processors, capable of performing processor-based (e.g., hardware-based) emulation of logic systems, such as integrated circuits (ICs), application specific integrated circuits (ASICs), central processing units (CPUs), graphics processing units (GPU), field-programmable gate arrays (FPGAs), and the like. By executing various forms of programmable logic, the emulation chips may be programmed to mimic the functionality of nearly any prototype logic system-design that is undergoing testing, sometimes called the "design under test" (DUT). Processor-based emulation allows logic system designers to prototype a logic system's design using reprogrammable computing hardware, before a manufacturer expends resources manufacturing a logic system product based on the design.

In processor-based emulations systems there are a number of basic computing processing resources needed; and there are number of resources that may be emulated. Generally, these resources, which could be employed and/or emulated by the processor-based emulation system, are circuits, and they may include various types of logic gates, such as registers, Boolean logic gates, memories, and the like. These gates are frequently used or emulated by emulation systems. As such, there have been a number of technological advances aimed at improving conventional emulation systems' use or emulation of these types of circuits. However, not every type of logic gate and circuit is well-addressed in conventional emulation systems. There are some types of gates where conventional emulation systems inefficiently emulate or are otherwise unable employ.

Some examples of logic gate circuits that may have not been well-serviced include content addressable memory and ternary content addressable memory (CAM/TCAM). These types of gates combine the ability to read and write, like a standard memory, but include the ability to search the contents. They are used in a number of fields, especially in networking hardware, such as routers, switches, firewalls, and the like. For example, CAM and TCAM memories are frequently used to store routing tables or MAC address lookup tables, because these memories are so quickly queried to determine how IP packets should be routed. The designers of the underlying circuitry for these types of networking devices would therefore appreciate an emulation system that provides improved capabilities to emulate, and thus more efficiently and accurately test, the logic gates and circuits of their CAM/TCAM circuit designs.

In conventional emulation systems, CAM/TCAM emulation is ordinarily accomplished using the standard resources—typically the processors and processor clusters. This involves creating the emulated output logic, using processors to act as improvised registers and to provide the comparison logic that is integral to CAM/TCAM functionality. But conventional emulation systems require a relatively large number of processors in order to emulate even the smallest CAM/TCAM. So even though it is possible for conventional emulation systems to emulate the functionality of CAM/TCAM logic circuits, it is also very expensive in terms of emulation resource capacity, demand, and availability. For example, a conventional emulation system with a CAM memory 32-bits-wide and 8-words-deep (32×8), the emulation system would need 32×8 (256) processors to store the CAM bits, plus another 32 processors to store a comparison value, and another 88 processors (8×(8+2+1)) to perform the emulation of the comparison logic. This would require about 376 processors. There would also be even more processors required to handle reading and writing of the CAM. This cost of about 1.5 processors per CAM-bit is very high.

What is needed is an efficient and low-cost means for recreating a CAM/TCAM memory and its functionality in a processor-based emulation system. Because processors perform the emulations in a processor-based emulation system, and the processors are generally inefficient, what is needed is an alternative means for recreating the CAM/TCAM memory and its functionality without using processors.

SUMMARY

Disclosed herein are systems and methods that address the above-discussed shortcomings in the art, and may also provide any number of additional or alternative benefits as well. The embodiments described herein recreate the functionality a CAM/TCAM memory circuit that can be integrated into a processor-based emulation system. Rather than using specialized gates or the existing processors, the embodiments described herein cause the existing memory circuits of the emulation system to imitate a search engine function that queries the existing RAM circuits, portions of which are reconfigured to function as CAM/TCAM memory. Taken together, the hardware-based search engine and the repurposed memory (e.g., RAM, SRAM, DRAM) addresses allow an emulation system to emulate the functionality of a CAM/TCAM memory. This can be implemented at very low cost to the emulation system, as it provides the ability to store more CAM/TCAM data at a very low cost. It can also use the existing system and emulation buses that other components (e.g., processors) of the system use to communicate with the memory, so expansion of the emulation system may not be required.

In an embodiment, a memory controller circuit of an emulation system configured to execute read and write commands associated with memories of the emulation system, where the memory controller comprises a memory block comprising: one or more memories configured to store one or more data bits at memory addresses in the one or more memories; a comparator logic circuit coupled directly to the one or more memories and a first register configured to store a set of pattern bits, the comparator logic circuit configured to generate a set of one or more output bits based upon comparing at least a portion of the set of pattern bits received from the first register and a set of one or more data bits read from one or more of the one or more memories, in accordance with a query-type instruction; and a test block comprising one or more circuits, including state machine circuit configured to, upon receiving a query instruction signal, transmit a special read instruction signal to the memory block, the special read instruction comprising the query-type instruction, the set of pattern bits to be stored into the first register, and a set of one or more memory addresses of the one or more data bits to be read into the comparator logic circuit.

In another embodiment, a set of memory block circuits of a memory controller circuit of an emulation system configured to execute read and write commands associated with memories of the emulation system, where the memory block circuits comprise a first register configured to store a set of one or more pattern bits representing a query; a comparator logic circuit configured to generate a set of one or more output bits representing a response to the query, the one or more output bits based upon comparing at least a portion of the set of pattern bits from the first register against a set of one or more data bits read from at least one memory of one or more memories, in accordance with a query-type instruction indicating a type of query; and a state machine controller configured to store the one or more pattern bits into the first register, transmit a special read instruction to the one or more memories instructing the at least one memory to send the one or more data bits to the comparator logic circuit, and to transmit to the comparator logic circuit the query-type instruction indicating the type of query.

In another embodiment, a method for emulating CAM and TCAM query functionality using memory circuits of an emulation system configured to execute read and write commands associated with memories of the emulation system, the method comprising upon a memory control circuit receiving a query instruction indicating one or more memory addresses of one or more memories of the memory control circuit, a set of pattern bits modeling a query, and a query-type indicator: storing, by the memory control circuit, the set of pattern bits into a first register of the memory control circuit, wherein the first register is coupled to a comparator circuit of the memory control circuit; transmitting, by the memory control circuit, into the comparator circuit a set of data bits stored in at least one memory of the one or more memories at the one or more addresses; and generating, by the comparator circuit of the memory control circuit, a set of one or more output bits based upon comparing the set of data bits from the memory addresses against the set of pattern bits in accordance with the query-type indicator.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

FIG. 3B shows an exemplary TCAM chart indicating the results of a TCAM query, according to an exemplary embodiment.

DETAILED DESCRIPTION

Figure 1:
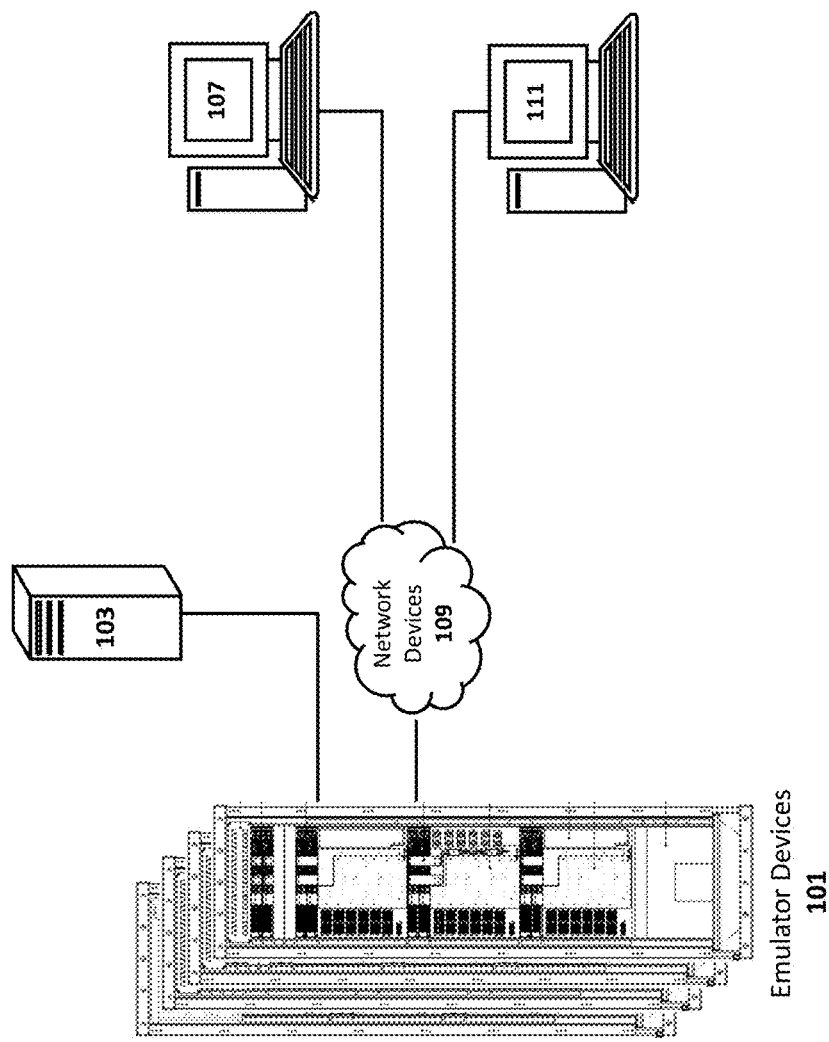
FIG. 1 shows exemplary components of an emulation system, according to an exemplary embodiment.

Reference will now be made to exemplary embodiments illustrated in the drawings, and specific language will be used to describe the same. It will nevertheless be understood that no limitation on the scope of potential embodiments is intended. Other embodiments may be used and/or other changes may be made without departing from the spirit or scope of the present disclosure. The illustrative embodiments described in the Detailed Description are not meant to be limiting upon the subject matter presented herein.

Components of Exemplary Emulation System

FIG. 1 shows components of an emulation system 100, according to an exemplary embodiment. The exemplary system 100 may comprise emulation devices 101, a server computer 103, a client computer 107, one or more network devices 109, and an administrative computer 111.

Emulation devices 101 may be a collection of computing hardware capable of being reprogrammed to execute emulation processes, such as those described herein. Non-limiting examples of emulation devices 101 may include emulation chips, logic boards, data buses, wiring interfaces, data lanes, non-transitory machine-readable media, and processors, among others. The emulation devices 101, such as emulation chips, may be programmable to process data inputs and generate data outputs according to instructions generated by compiling a schematic design ("netlist") of a particular logic system, such as a prototype circuit design, sometimes referred to as the "design under test," or "DUT."

Emulation devices 101 may be coupled to, or may be integrated into the same hardware as, a server computer 103 having separate processors from the processors of the emulation devices 101. The server computer 103 may execute software modules that manage and control the resources (e.g., processors, buses, instruction memories, random access memories), and performance of the emulation devices 101. Non-limiting examples software modules executed by the server computer 103 may include a compiler module and a configuration manager module.

A server computer 103, or other computing device comprising a processor capable of performing the processes described herein, of the emulation system 100 executing a compiler may programmatically compile a machine-readable netlist file into executable code, which is then converted and distributed as hardware-readable instruction sets to resources, such as emulation chips, of the emulation devices 101. The instructions indicate for each of the emulation devices 101 that receive an instruction set, which components of the system 100 will be the source of the next data input, and which component of the system 100 will be the destination of the particular component's next data output. In operation, the compiler module, which may be executed by an integrated or stand alone server computer 103, may receive and compile a netlist design file containing the logical gate design the DUT. The compiler then generates a virtual logic file based on the compiled netlist. To generate the virtual logic file, the compiler must "map" the DUT's gate design logic into the hardware components of the emulation devices 101 based on the particular function to be performed and the capabilities of the resources. The compiler then generates the instructions for the processors and other hardware resources of the emulation devices 101, based on the virtual logic file. The virtual logical file and the resulting instruction sets informs the hardware (e.g., processors, multiplexers) of the emulation devices 101 how to behave so as to emulate the behavior of the DUT. These instructions and other data, such as preloaded values, may then be distributed to the components of the emulator devices 101.

A configuration manager may be software module executed by an integrated or stand alone server computer 103, and may be configured to track the status and control the tasks performed by components of the emulation devices 101. The configuration manager may determine which components of the emulation devices 101 are available or unavailable to receive the appropriate portions of the virtual logic as generated by the compiler. The configuration manager may determine which components of the emulation devices 101 are available or unavailable to receive parts of the virtual logic generated by the compiler. For example, in some cases, the configuration manager continuously polls or self-tests the resources of the emulation devices 101 to identify faulty hardware components. The control administrative tasks performed by the compiler, the configuration manager, and other system control hardware components of the emulation devices 101 may communicate with one another, and with emulation processors, through dedicated system buses, which may be distinct data signal buses from the emulation buses. System buses may carry data signals containing overhead or administrative operational commands indicating how the emulation devices 101 should function, or to test the functions of the emulation devices 101. Emulation buses may carry data signals containing the emulation data values produced by the processors as a result of emulating the DUT according to the netlist design of the DUT.

Emulation devices 101 may include emulation chips, which may be integrated circuits capable of performing programmatic logic functions used for hardware-based, sometimes call "processor-based," emulation. The emulation chips comprise a number of emulation processors that are programmed to emulate to DUT before actual production and manufacture of a circuit that will receive the DUT. During execution of an emulation test, the programmatic logic of the DUT may be compiled down to machine-readable instruction sets that are executed by the emulation processors of emulation chips. Working together, the collection of emulation chips and other hardware components of the emulation devices 101 emulate how data bits would be processed in a real-world scenario by a circuit having the DUT. Data bits produced by the emulation processors during execution of an emulation, are moved between the emulation processors or between emulation chips using one or more emulation buses. Overhead or administrative data bits used to test the operability of emulation devices 101, or to manage execution of emulation jobs, may be transmitted between controller processors using a system bus. For example, one or more synchronization bits may be transmitted to each emulation chip associated with a particular emulation job in order to keep each emulation chip on the appropriate execution step of an emulation cycle.

Emulation devices 101 may also include an internal memory controller, which may be an integrated circuit comprising one or more circuits that control memory management for data inputs and outputs used by the emulation devices 101. In many cases, data bits produced by emulation processors or other hardware components contributing to the emulation bus may send data output bits to registers for brief storage or queuing for the next processor. But in some cases, data may be needed to be stored in memory, such as random access memory (e.g., RAM, SRAM, DRAM), flash memory, or the like. Administrative data and overhead commands may be stored in memory, as well, since these may be too complex datasets for efficient storage and retrieval for registers to handle. There may be any number of additional or alternative reasons for the emulation devices 101 to include memory. Yet, in some embodiments, the emulation devices 101 may employ one or more internal memory control circuits to manage, update, and/or query the memory.

A client computing device 107 may be used for controlling or otherwise managing various aspects of the emulation system 100, such as submitting a netlist design file for a new or updated logic system design that a design wants to test through emulation. The client computing device 107 may be logically internal or external to a computer network comprising any number of networking devices 109 and supporting communications among one or more emulator devices 101 and/or client computer devices 107. For example, the client computing device may be logically outside of a firewall functioning as a gateway to the network of the emulator devices 101. The client computing device 107 may be any computing device capable of performing the various tasks and process described herein, such as configuring components of the emulation system 100 (e.g., netlists, chips, processors, logic boards, configuration manager) to emulate the particular logical system (e.g., ASIC, CPU, GPU) being tested. Non-limiting examples of the client computing device 107 may include a workstation computer, a laptop computer, a tablet device, a server computer, and the like. In some cases, the client computing device 107 may be proximate to the emulator devices 101, and may therefore be coupled to the emulator devices 101 through network devices 109 including, for example, an InfiniBand connection. In some cases, the client computing device 107 may not be proximate to the emulator devices 101, or may be logically external to a computer network hosting the emulator devices 101 (e.g., outside of a firewall). In such cases, the client computing device 107 may be connected to the emulator devices 101 network devices 109 supporting communication over some distance or between network boundaries, such as an Ethernet connection. Additionally or alternatively, in some instances, the client computing device 107 may be integrated into the emulator devices 101, thereby forming a single device for emulating logic system designs, configuring the emulation devices 101, and submitting a DUT.

An administrative computer 111 may be used by a system administrator or an end-user to manage the emulation devices 101, and to configure aspects of emulation routines. The administrative computer 111 may be any computing device comprising a processor that executes various software modules instructing the administrative computer 111 to execute the various tasks and processes described herein. Non-limiting examples of an administrative computer may include a laptop computer, a workstation computer, a tablet, a server, and the like. The administrative computer 111 may allow the administrator or end-user to define certain execution parameters of how the emulator devices 101 execute emulation routines, sometimes referred to in the art as "emulation jobs." For example, like with some embodiments of the client device 107, an administrative computer 111 may be used expressly allocate resources of the emulation devices 101 to perform certain emulation routines. As another example, the administrative device 111 may be used submit or modify a netlist file of a DUT to institute a new emulation routine. In a further example, in the event an emulation routine does not function as expected, the administrative computer 111 may be used to troubleshoot and reconfigure the emulation devices 101, and/or debug aspects of compiled virtual logic code or netlist file.

In some embodiments, the administrative computer 111 may be proximate to the emulator devices 101 or logically internal to a network hosting the emulator devices 101. In such embodiments, the administrative computer 111 may be coupled to the emulator devices 101 through network devices 109, such as an InfiniBand connection. In some embodiments, the administrative computer 111 may not be proximate to the emulator device 101, or may be logically external to a computer network hosting the emulator devices 101 (e.g., outside of a firewall). In such cases, the administrative computer 111 may be connected to the emulator devices 101 through network devices 109 and protocols, such as an Ethernet connection. Additionally or alternatively, in some instances, the administrative computer 111 may be integrated into the emulator devices 101, thereby forming a single device for emulating logic system designs, configuring the emulation devices 101, and submitting a DUT.

Internal Memory Controller Circuits

Figure 2:
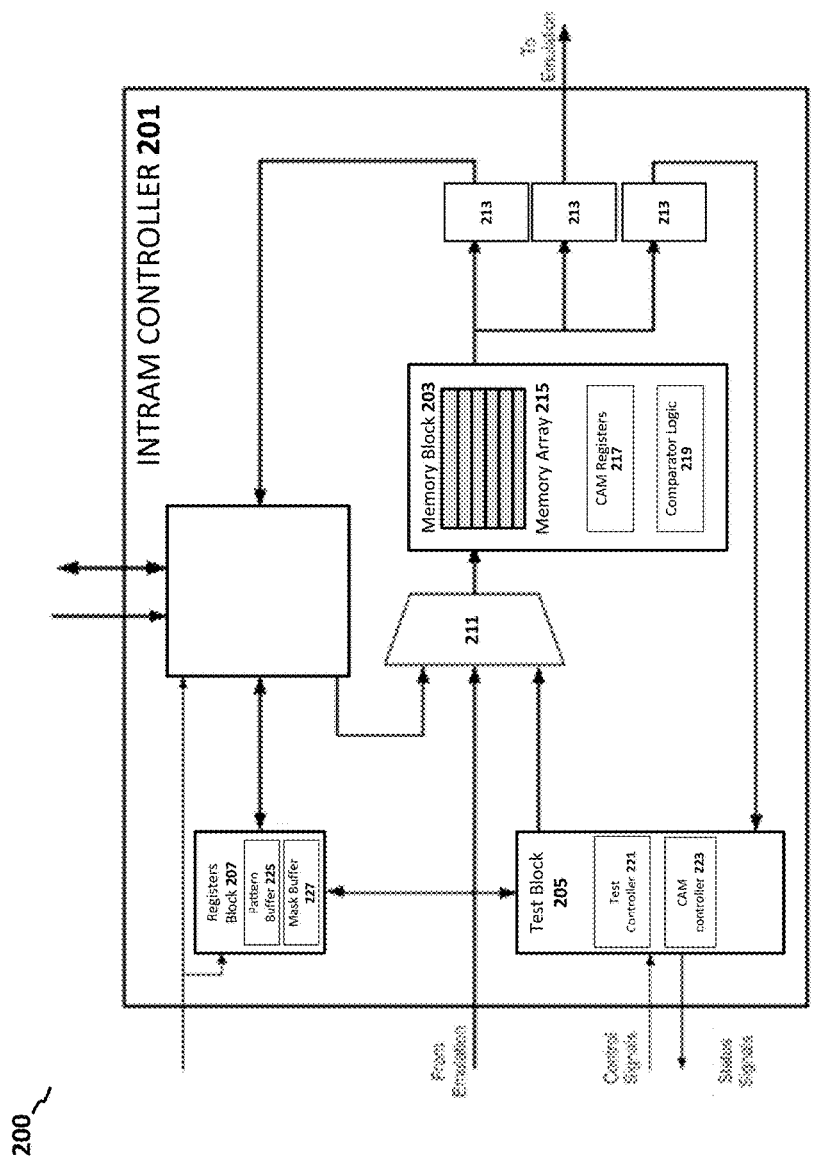
FIG. 2 shows exemplary components of an internal memory control circuit of an emulation system, according to an exemplary embodiment.

FIG. 2 shows a schematic representation of an internal memory (INTRAM) controller 201 circuit of an emulation system 200, according to an exemplary embodiment. The INTRAM controller 201 may comprise any number of integrated circuit components, such as semi-conductor memory, one or more data signal buses, processors, transistors, and any other type of circuitry that could be a component or sub-component of an integrated circuit. The components of the INTRAM controller 201 may be physically and logically organized into any number of functional blocks, representative of a particular functionality provided by the underlying physical components (e.g., registers, processors, memory, logic gates, instruction set memory) within the particular block. For instance, a memory block 203 may comprise a memory array 215, comprising an array of one or more electronic memory circuits (e.g., SRAM, DRAM, flash memory, EEPROM), configured to store data (e.g., digital bits) received in signals generated from other circuits of the system 200. As such, the underlying components organized into the memory block 203 provide the INTRAM controller 201 with storage functionality. It should be appreciated, however, that there is no requirement for the components of the INTRAM controller 201 to be organized into the same blocks as shown in FIG. 2. In some cases, the components of the INTRAM controller 201 may not be organized into any blocks.

Ordinarily, computer memory (e.g., RAM, SRAM, DRAM, flash) is configured to return data bits stored at particular addresses in response to receiving a query or request for whatever is stored at that particular memory address. In contrast to typical memory, a CAM/TCAM memory is configured to search the entire CAM/TCAM memory to determine whether a set of data bits are found in the memory matching a set of queried or requested data, or so-called "pattern bits." Rather than returning the queried data bits, the CAM/TCAM memory typically returns one or more addresses where the pattern bits were identified, though it may also return the queried data and additional information as well. It should be noted that in some implementations, in addition to a memory controller circuit (e.g., INTRAM controller 201) being capable of executing and managing the specialized CAM/TCAM operations as described herein, the memory controller circuit (e.g., INTRAM controller 201) may also function as an ordinary memory controller—it can still execute and manage ordinary read and write operations.

A CAM/TCAM memory may have one or two query types: a binary CAM type of query, and a ternary (TCAM) type of query. A CAM query typically uses a set of pattern bits to identify whether data bits stored in the memory match, or do not match, the pattern bits. A TCAM query utilizes an additional set of bits, or "mask bits," allowing for additional matching states. For example, the mask bits may allow for a so-called "care" and a so-called "don't care" state. Using these additional mask bits, the TCAM query may determine for each bit, depending on the mask bit, whether the query should care whether there is a match or not. This might, for example, allow for wildcard matching, because the TCAM could determine that a stored data bit does not match a pattern bit, but return a match because the mask bit indicates a "don't care." For instance, the TCAM may have stored data bits {"10000", "10010", "10100", "10110"}, and receive pattern bits {"10000"} and mask bits {"10ZZ0"}. Because of the "don't care" state in the mask bits (reflected by the "Z"), the TCAM query will match any of the four stored data bits in the memory. As described herein, the components of the INTRAM controller 201 and emulation system 200 may be repurposed, configured, or otherwise adapted, to emulate such functionality, without using a special CAM/TCAM circuit or emulation processors.

Memory Block

In the exemplary system 200, the INTRAM controller 201 may comprise a memory block 203, a test block 205, registers block 207, a control block 209, an input multiplexer 211, and output registers 213. The INTRAM controller 201 may include any number of signals buses that support signal transmissions among components within the INTRAM controller 201, and between components of the system 200. A memory block 203 may comprise a memory array 205, one or more CAM registers 217, and comparator logic 219.

A memory array 215 may comprise one or more memories configured to store data bits received in data signals from other components of the emulation system 200 (e.g., emulation processors) or the INTRAM controller 201 (e.g., test block 205). It should be appreciated that the memory array 215 may be include memory of nearly any size, and may be organized and accessible to components of the emulation system 200 in a variety of ways. For example, in some implementations, the memory array 215 may be organized and accessed as a monolithic block of memory; and in some implementations, the memory array 215 may comprise a plurality of smaller memories organized to form the memory array 215. Additionally or alternatively, the memories of the memory array 215 may comprise a plurality of smaller memories that combine to be accessible and understood by the components of the emulation system 200 as a single monolithic memory. It should be appreciated that the memory array 215 the memory instances contained therein, are shown in FIG. 2 as components of the INTRAM controller 201 merely for ease of discussion and for illustrative purposes. One having skill in the art would appreciate all or some of the memories may be located inside or outside the INTRAM controller 201 and that there is no requirement for the memories or the memory array 215 to be limited only to embodiments in which such components are internal to the INTRAM controller 201. For instances, one or more memories or the memory array 215 may be outside of the INTRAM controller 201, as long as such memories or memory array 215 remain accessible by the circuitry responsible for, or otherwise manages, CAM/TCAM searches.

A CAM registers 217 may be register circuits, or any other type of circuits capable of storing state data, configured to store pattern bits, mask bits, and other types of bits received by the memory block 203 to execute CAM functions. In operation, a registers block 207 provides pattern bits and mask bits to the memory block 203, and when CAM functionality is triggered by a test block 205, the pattern bits and mask bits are transmitted and stored, or "read," into the CAM registers 217. In some cases, the CAM registers 217 may be receive pattern bits and/or mask bits directly from the test block 205. In such cases, the pattern buffer 225 and mask buffer 227 may be located within the CAM registers 217.

Comparator logic 219 may be a series of one or more circuitry logic gates that may be located anywhere within the circuitry of the memory block 203, before data is outputted to other components of the system 200, such as the output registers 213. Although the components of the INTRAM controller 201 are initially configured to manage and store data for ordinary retrieval and storage processes, the registers and/or logic gates of the comparator logic 219 may be instructed to emulate the querying functionality of a conventional CAM/TCAM circuit. As such, it is the comparator logic 219 that is configured to operate as a hardware-based search engine, and thus may be repurposed to provide the emulator system 200 with certain aspects of the CAM/TCAM functionality, so that the emulator system 200 may emulate CAM/TCAM circuitry DUTs. For example, the comparator logic 219 may be configured to perform the memory-querying aspects of CAM/TCAM functionality. The comparator logic 219 may execute the CAM/TCAM functionality in a number of different operational modes, depending upon the execution instructions received from the test block 205. For instance, the comparator logic 219 may perform queries of the memory array 215 using a CAM operation mode or using a TCAM operation mode. In this way, the emulation system 200 may repurpose existing components of an emulation system 200 to emulate the functionality of the CAM functions or TCAM functions, conventionally performed by circuits of routers, switches, and other computing networking devices.

In operation, the comparator logic 219 may receive execution instructions and input data values from the test block 205, memory array 215, and CAM registers 217. The values of a pattern buffer 225 and mask buffer 227 are read into the CAM registers 217, and the values of the memory array 215 are read into comparator logic 219, as indicated by the addresses listed in a special memory "read" command received from the test block 205. The logic gates of the comparator logic 219 then output data signals containing the values determined by the comparator logic 219, according to the execution instructions, data bits received from the memory array 215, the pattern bits, and the mask bits.

Importantly, the CAM/TCAM functions are executed by components of the INTRAM controller 201 (e.g., the comparator logic 219) that are logically and structurally proximate to the memory array 215. Conventional emulation systems inefficiently execute CAM functions using circuitry components (e.g., emulation processors) comparatively far from the memory 215, resulting in high latencies that are too high to efficiently emulate a CAM/TCAM circuit. In some embodiments, the test block 205 of the exemplary system 200 may be a distinct structural feature of the INTRAM controller 201. But, in some embodiments, one or more circuits and functions of the test block 205 may be integrated into the memory block 205, thereby moving additional features for CAM/TCAM functions closer to the memory array 215.

Test Block

A test block 205 may comprise integrated circuits configured to manage and control various behaviors of the INTRAM controller 201 during emulation jobs. The circuits of the test block 205 may be logically and physically organized into sub-components of the test block 205 that each provides certain functionality to the test block 205, as well as the INTRAM controller 201, and/or the emulation system 200 as a whole. As previously mentioned, in some embodiments, one or more components of the test block 205 may be partially or entirely integrated into the memory block 203. The test block 205 may comprise circuitry, such as test controller 221 and/or a CAM controller 223, functioning as a state machine that may be configured to signal instructions to components of the system 200, such as the memory array 215, pattern buffer 225, mask buffer 227, and/or comparator logic circuit 219. The test controller 221 and CAM controller 223 are merely exemplary of possible state machines, as each could be configured to signal or otherwise trigger behaviors upon receiving data signals satisfying certain logic gate conditions within the component. It should be appreciated that the test block 205, INTRAM controller 201, or emulation system 200 may comprise additional or alternative state machines, using any number of circuits, memory or other hardware components.

In the exemplary system 200, the test block 205 may include a test controller 221 and a CAM/TCAM controller 223. The test block 205 may receive administrative instructions (e.g., CAM/TCAM special query instructions, special memory read instructions, administrative commands for validating memory block 203 functionality) and/or data inputs (e.g., register initialization values, memory preloaded values), through a number of system buses of the emulation system 200, from other components of the system 200. In some cases, the test block 205 may receive various types of instructions and/or data inputs from a compiler. For example, a compiler or a configuration manager may transmit status test signals to the INTRAM controller 201 instructing the test block 205 to test the functions of the memory block 203. As another example, a control block 209 may transmit instructions for the test block 205 to transmit CAM/TCAM query parameters (e.g., pattern bits, mask bits) to a pattern buffer 225 and a mask buffer 227. However, it should be appreciated that the instructions and parameters instructing the test block 205 to execute administrative functions or to instruct the INTRAM controller 201 to execute CAM/TCAM functions, may be received by the test block 205 from any number of sources, through any number of buses. For example, in some embodiments, a data signal containing data bits instructing the test block 205 to begin executing CAM/TCAM functions, may be received via an emulation bus configured to transmit bits directly related to an ongoing emulation job; or, in some embodiments, the data bits instructing execution of CAM/TCAM functionality may be received by the test block 205 through a side channel, such as system bus configured to transmit bits associated with administrative tasks. As shown in FIG. 1, the INTRAM controller 201 may comprise a test controller 221 and CAM controller 223. However, these are merely exemplary components of circuits that may be in the test block 205. It should be appreciated that these components may be found within a memory block 203 or any other logical organization of circuits in the INTRAM controller 201 or these component circuits may not be located within a particular organization block. Moreover, it should also be appreciated that these are merely exemplary components to show the possible functions a test block 205, and thus these components may be alternatively organized, combined, or may be omitted altogether.

A test controller 221 may comprise a set of one or more integrated circuit components or sub-components configured to control execution of the test block 205 and the INTRAM controller 201. In some implementations, the test controller 211 may read and write values to components of the INTRAM controller 201 (e.g., memory block 203, registers block 207). The test controller 221 may initialize (e.g., read, write) values in components of the memory block 203, or elsewhere in the INTRAM controller 201, prior to execution of an emulation job. The test controller 221 may then be used to determine whether the memory array 215 is operating appropriately by reading and writing values into the memory block 203 and reviewing the outputs.

A CAM controller 223 may comprise a set of one or more integrated circuit components or sub-components configured to control execution of the CAM functions of the INTRAM controller 201. The CAM controller 223 may manage reading from the memory block 203 and determines the address of the CAM comparison functions. In particular, the CAM controller 223 may manage which address or addresses are read into and queried with the comparator logic circuit 219. In operation, the CAM controller 223 may transmit a special "read" command to the memory block 203, instructing the memory block 203 to read one or more addresses from the memory array 215, into the CAM registers 217, or the registers and/or logic gates of the comparator logic circuit 219. The data stored in these addresses is then fed to the comparator logic 219, which, in turn, compares the data bits against search query bits (e.g., pattern bits, mask bits) that are loaded, or otherwise stored, into the CAM registers 217.

In some implementations, the INTRAM controller 201 may execute an auto-comparison function. During an auto-comparison function, the CAM controller 223 or other circuit of the test block circuits 205 may continuously and iteratively issue read commands to successive memories of the memory array 215. Each memory, at each iterative memory address, may read the data bits stored at the memory address into the CAM register or other register used by the comparator logic 219. During the auto-comparison routine, the comparator logic circuit 219 may continuously execute the querying CAM/TCAM function, as each new, successive set of data bits read from memory arrive at the comparative logic 219.

Registers Block

A registers block 207 may comprise one or more integrated circuit components configured to receive and store data bits received from any number of components through any number of buses, and to transmit data bits to any number of components through any number of buses. In the exemplary system 200, the registers block 207 may comprise a pattern buffer 225 and a mask buffer 227, configured to particular sets of data bits received from the test block 205, when the CAM controller 223 of the test block 205 receives instructions to begin operating the CAM/TCAM functionality aspects of the INTRAM controller 201.

Pattern buffers 225 may be one or more registers or other circuitry capable of storing a pattern, which may be a set of data bits representing query parameters that may be issued to the comparator logic 219. In some implementations, the pattern bits may be written to the pattern buffers 225 through an emulation bus configured to carry data signals having data directly related to ongoing emulation jobs; and, in some implementations, the pattern bits written to the pattern buffers 225 may be received from a test block 205 or control block 209 through a system bus, which may be a side-channel bus separate from the emulation bus for communicating administrative instructions and/or configuration data. For example, the pattern buffers 225 may comprise two, 64-bit registers configured to store patterns of up to 64-bits, which may be stored via the system bus or via the emulator bus. It should be appreciated that the pattern buffers 225 may be located in any number of locations logically and structurally proximate to the comparator logic 219. As an example, the pattern buffers 225 of the exemplary system 200, as shown in FIG. 2, are components of the registers block 207. But, in some embodiments, the pattern buffers 225 may be components of the memory block 203.

Mask buffers 227 may be one or more registers or other circuitry capable of storing a mask, which may be a set of data bits representing query parameters that may be issued to the comparator logic 219. In some implementations, the mask bits may be written to the mask buffers 227 through an emulation bus configured to carry data signals having data directly related to ongoing emulation jobs; and, in some implementations, the mask bits written to the mask buffers 227 may be received from a test block 205 or control block 209 through a system bus, which may be a side-channel bus separate from the emulation bus for communicating administrative instructions and/or configuration data. For example, the mask buffer 227 may comprise two, 64-bit registers configured to store masks of up to 64-bits, which may be stored via the system bus or via the emulator bus. It should be appreciated that the mask buffer 227 may be located in any number of locations logically and structurally proximate to the comparator logic 219. As an example, the mask buffers 227 of the exemplary system 200 are shown, in FIG. 2, as being part of the registers block 207. But, in some embodiments, the mask buffers 227 may be a component of the memory block 203.

Other Exemplary Components

In some embodiments, the INTRAM controller 201 may comprise an input multiplexer 211 comprising one or more processors, or other circuitry, configured to manage the input flow of data into the memory block 203. In some implementations, the input multiplexer 211 may comprise an instruction memory store that stores a series of execution instructions that control the behavior of the input multiplexer 211. For example, as shown in FIG. 2, three signal buses may be configured to feed data to the memory block 203, but the memory block 203 may be limited in the number of data bits it can receive in a given emulation cycle. The instructions in the instruction store of the input multiplexer 211, may instruct the input multiplexer 211 which of the buses to select an input from for a particular emulation cycle, which the input multiplexer 211 may then output to the memory block 203.

Output registers 213 may store outputs produced by the memory block 203, such as comparison logic outputs produced by the comparator logic 219, or data values "read" from the memory array 215. The output registers 213 may temporarily store the data outputs for one or more emulation cycles, and then may transmit the data to any number of subsequent components of the INTRAM controller 201 or elsewhere in the emulation system 200.

Hardware-Based Search Engine for CAM/TCAM Queries

Figure 3A:
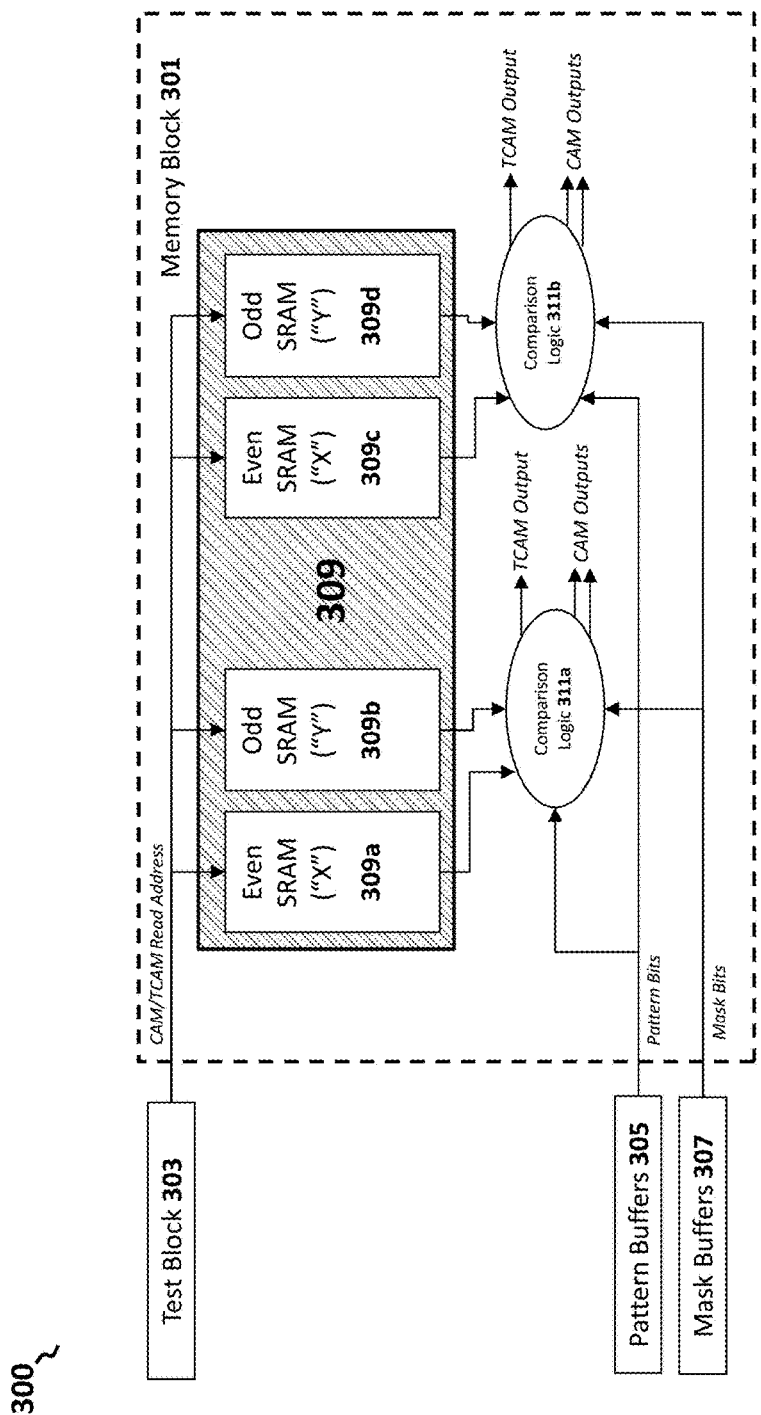
FIG. 3A shows logical data flow among components of an internal memory control circuit in an emulation system, according to an exemplary embodiment.

FIG. 3A shows the logical data flow of data bits among components of an emulation system 300 while emulating CAM/TCAM functionality, according to an exemplary embodiment. The exemplary system 300 may comprise a memory block 301, a test block 303, pattern buffers 305, and mask buffers 307. The memory block 301 may comprise memory array 309 and comparators 311. It should be appreciated that the registers of the pattern buffers 305 and mask buffers 307 may be located at nearly any location of an integrated circuit structurally and logically proximate to the comparison logic 311 in the memory block 301. As such, the pattern buffer 305 and mask buffer 307 may be components of the memory block 301, or may be components of a separate set of one or more registers logically and structurally close to the comparison logic 311. It should be noted that, in some implementations, in addition to a memory block 301 being capable of executing and managing the specialized CAM/TCAM operations as described herein, the memory block 301 may also function as an ordinary collection circuits that manage and execute processes associated with memory circuitry; for instance, the memory block 301 may still execute and manage ordinary read and write operations. In such embodiments, the CAM/TCAM capabilities are added to the memory block 301 as the result of the query instructions, read instructions, other configurations.

When a set of test block circuits 303 receive a query instruction from an external component of the emulation system 300, such as an emulation processor or the compiler, the test block 303 may be configured to transmit special read instructions or data bits to components of a memory controller circuit, such as a memory block 301, pattern buffers 305, and mask buffers 307. For instance, the test block 303 may transmit special read instructions indicating to the memory block 301 that a CAM/TCAM search will begin. Under ordinary operational circumstances, memories will only read portions of the data bits stored at particular addresses, but the special read instructions instruct the memories to read all of the data at a particular address into one or more registers used by a comparator logic circuit 311. The test block 303 may also transmit one or more parameters associated with the CAM/TCAM functionality, such as the type of search (e.g., CAM or TCAM), and/or an execution mode (e.g., single search, continuous search). In some implementations, under ordinary operational circumstances, the comparator logic may ignore pattern bits and mask bits, or may otherwise not execute the querying functions for CAM/TCAM functionality. However, the special read instructions may enable the comparison logic 311 to perform the various comparisons on the data bits read from the memory array 309, effectively imitating the querying capabilities needed to emulate a CAM/TCAM circuit. In addition, after receiving the query instruction, the test block 303 may also transmit pattern bits and mask bits to the pattern buffers 305 and mask buffers 307, respectively. The pattern bits and mask bits may be indicated in the query instruction or may be pre-stored into the respective registers.

The memory array 309 may comprise any number of memories (e.g., SDRAM), which may include a single monolithic memory, or several memories that are treated as a single memory. For example, in the exemplary memory block 301, the memory array 309 may comprise four memories that are each 72 b×16K in size. When executing ordinary read and write access instructions, the four memories may be accessed one-at-a-time, to make it look like the memory block 301 comprises a single memory that is 72 b×64K in size, rather than the four smaller memories of 72 b×16K. During CAM/TCAM searches, when the emulation system 300 issues query instructions to the test block 303, whole portions of memory addresses are read into the registers of the memory block 301 (e.g., registers of comparison logic 311), and then the emulation system 300 can search four CAM "words" per emulation step, one per memory instance 309a-d (e.g., a memory instance 309a-d and comparison logic 311 can perform one CAM comparison); or two TCAM "words" per emulation step, per two memory instances 309a-d (e.g., each memory pair 309a-b, 309c-d and comparison logic 311a-b can perform one TCAM comparison).

It should be appreciated that the memory sizes (e.g., sizes of instances 309a-d, sizes addresses within the memory instances 306a-d, size of the memory 309) mentioned above are merely exemplary, used only for ease of explanation, and should not be viewed as limiting on the possible memory sizes of other possible embodiments. Furthermore, although each comparison logic circuit 311a-b appears to be shared between two pairs of instances 309a-d in FIG. 3, it should be appreciate that is merely illustrative of a convenient configuration for TCAM operations. In some embodiments, the TCAM comparison logic functionality and the CAM comparison logic functionality may be executed using distinct, separate components of the system 300. In such embodiments, there would be one TCAM comparison logic block 311 per memory instance pair 309a-b, 309c-d; and, in a separate and distinct memory block 301, there would be one CAM comparison logic block 311 per one memory instance 309.

Exemplary TCAM Execution

When the test block 303 receives query instructions to begin a TCAM-type query, the components of the emulation system 300 are instructed to behave as a search engine that searches each memory in the memory array 309. As shown in FIG. 3A, when the test block 303 receives query instructions to begin a TCAM query, the components of the emulation system 300, treat the memory array 309 as logically segmented into four memory instances 309a-d.

When a special read instruction for a TCAM query is issued, the memories are combined into two groups of four instances 309a-d, and all four memories are read into one of two comparison logic circuits 311a-b at the same time according to the read address indicated by the special read instruction. In addition, because the exemplary system 300 may comprise two pattern buffers 305 and two mask buffers 307, each group of four 309a-d memory instances is associated with one pattern buffer 305 and one mask buffer 307. The data bits read from the data array instances 309a-d are fed into one or more compare logic circuits 311a-b, and may be logically compared against the pattern bits and mask bits of the respectively associated pattern buffers 305 and mask buffers 307.

During TCAM comparisons, the comparison logic gates 311a-b determine the matching results for the search query according to, in part, a predetermined TCAM bit-matching table 312, such as the one shown in FIG. 3B. It should be appreciated, however, that the TCAM table 312 is merely a human-readable representation of the logical configurations implemented on the comparison logic gates 311a-b. Only in some embodiments is the TCAM matching table 312 a software-based construct or a separate set of logical circuits, actively referred to by the comparison logic gates 311a-c. Using the TCAM table 312, the comparison logic gates 311a-b may determine the results to produce based upon the pattern bits, mask bits, and the data read from the memory instances 309a-d.

Referring to the table 312 shown in FIG. 3B, the result of comparing pattern bits against the data bits read from "even" memories (instance 0 309a, instance 2 309c) are called "X," and the results of comparing pattern bits against the data bits read from the odd memories (instance 1 309b, instance 3 309d) are be called "Y." If the mask is zero (0) then a match is returned because the TCAM does not care whether there was a match. Based on the results indicated in the table (seen in the "Match On" row), output bits comprising ones and zeros will be generated. In the exemplary embodiment, this may produce a 64-bit result due to the memory sizes of the exemplary memory block 301. The 64-bit results of each portion of the groups may then be AND'ed to produce one bit per bit of the data being queried.

Exemplary CAM Execution

When the test block 303 receives query instructions to begin a CAM-type query, the components of the emulation system 300 are instructed to behave as a search engine that searches each memory in the memory array 309. When the test block 303 receives query instructions to begin a CAM query, the test block 303 issues a special read instruction to one or more components of the emulation system 300 to treat the memory array 309 as a set of four CAM-enabled memories 309a-d, where each memory 309a-d is associated with, in this example, one of two comparison logic circuit 311a-b, which may be pre-assigned or may be indicated by the instructions received from the test block 303.

When a special read instruction for a CAM query is issued, the four memory instances 309a-d are read into one of two comparison logic circuits 311a-b at the same time according to the read address indicated by the special read instruction. In addition, the exemplary system 300 may comprise two pattern buffers 305 and two mask buffers 307. The data bits read from the memory instances 309a-d are then fed into one or more compare logic circuits 311a-b, and may be logically compared against the pattern bits and mask bits of the respectively associated pattern buffers 305 and mask buffers 307. In some implementations of CAM operations, there may be a pattern buffer 305 for each memory instance 309a-d, and the CAM operation may produce 1-bit of comparison output per instance 309a-d. For instance, if there are four memories 309a-d, the CAM operations may produce four output bits. In such implementations, a comparison logic circuit 311a-d or other component may reuse or repurpose the registers of the mask buffer 307 as a pattern register of a pattern buffer 305, when doing CAM. In contrast, for many TCAM operations, the exemplary system 300 would be configured to use, for each memory pair (pair #1 309a,b, pair #2 309c,d), one pattern buffer 305 and one mask buffer 307.

When a query instruction is received, the test block 303 issues a special read command to the memories 309 at particular addresses instructing the memories 309 to feed the data bits found at the one or more addresses into a first comparison logic gate 311a. Pattern bits and mask bits are also fed to the comparison logic gate 311a, from a pattern buffer 305 and a mask buffer 307, which may be registers configure to receive and store pattern bits and mask bits from the test block 303. One having skill in the art would recognize that mask bits may or may not be employed in all CAM-type queries, as CAM searches typically have a binary result for each pattern bit—whether the pattern bit matches a stored data bit. Nevertheless, in some embodiments, the mask bits may be employed to provide additional functionality for emulating binary CAM queries. For example, in some embodiments, the mask bits may be used to enable the functionality of the comparison logic 311 circuits. In some cases, each of the mask bits may be set to "care," such that the comparison logic 311 circuits never ignore the result of comparing a pattern bit against a stored data bit.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc., are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A memory controller circuit of an emulation system configured to execute read and write commands associated with memories of the emulation system, the memory controller comprising:
  a memory block of the emulation system, the memory block comprising:
    one or more memories configured to store one or more data bits at memory addresses in the one or more memories; and
    a comparator logic circuit coupled directly to the one or more memories and a first register configured to store a set of pattern bits, the comparator logic circuit configured to generate a set of one or more output bits based upon comparing at least a portion of the set of pattern bits received from the first register and a set of one or more data bits read from one or more of the one or more memories, in accordance with a query-type instruction such that the memory block is configured to emulate a content addressable memory (CAM) or ternary content addressable memory (TCAM) within the emulation system; and
  a test block of the emulation system, the test block comprising one or more circuits, including state machine circuit configured to, upon receiving a query instruction signal, transmit a special read instruction signal to the memory block, the special read instruction comprising the query-type instruction, the set of pattern bits to be stored into the first register, and a set of one or more memory addresses of the one or more data bits to be read into the comparator logic circuit,
    wherein the special read instruction further comprises an indication to the memory block that a CAM or TCAM query will begin and a parameter indicating an execution mode of the CAM or TCAM query.

2. The memory controller circuit according to claim 1, wherein the query-type indicated by the special read instruction is selected from a CAM-type query or a TCAM-type query.

3. The memory controller circuit according to claim 1, wherein a subset of the one or more addresses of at least one memory of the one or more memories is dynamically configured to function as content-addressable memory.

4. The memory controller circuit according to claim 1, wherein a subset of the one or more addresses of at least one memory of the one or more memories is dynamically configured to function as ternary content-addressable memory.

5. The memory controller circuit according to claim 4, further comprising a second comparator logic circuit configured to generate a second set of one or more output bits based upon comparing at least a second portion of the set of pattern bits received from the first register and a second set of one or more data bits received from the one or more memories.

6. The memory controller circuit according to claim 5, the memory block further comprising a second register configured to store a set of one or more mask bits received from the state machine of the test controller.

7. The memory controller circuit according to claim 6, wherein the comparator logic circuit is further configured to compare at least a portion of the set of one or more mask bits received from the second register against the one or more data bits read from the one or more memories, and at least a portion of the set of pattern bits.

8. The memory controller circuit according to claim 1, wherein the state machine circuit is configured to receive the query instruction signal via an emulation bus, the emulation bus configured to communicate data signals containing input and output values generated by one or more emulation processors of the emulation system.

9. The memory controller circuit according to claim 1, wherein the state machine circuit is configured to receive the query instruction signal via a system bus, the system bus configured to communicate control signals containing operational commands for the emulation system.

10. The memory controller circuit according to claim 1, wherein the state machine circuit is further configured to transmit one or more pre-loaded data bits to the memory block for storage into at least one memory of the one or more memories, prior to receiving the special read instruction.

11. A set of memory block circuits of a memory controller circuit of an emulation system configured to execute read and write commands associated with memories of the emulation system, the memory block circuits comprising:
  a first register configured to store a set of one or more pattern bits representing a query;
  a comparator logic circuit configured to generate a set of one or more output bits representing a response to the query, the one or more output bits based upon comparing at least a portion of the set of pattern bits from the first register against a set of one or more data bits read from at least one memory of one or more memories, in accordance with a query-type instruction indicating a type of query such that the memory block circuits are configured to emulate a content addressable memory (CAM) or ternary content addressable memory (TCAM) within the emulation system; and
  a state machine controller configured to store the one or more pattern bits into the first register, transmit a special read instruction to the one or more memories instructing the at least one memory to send the one or more data bits to the comparator logic circuit, and to transmit to the comparator logic circuit the query-type instruction indicating the type of query, wherein the special read instruction comprises an indication to the one or more memories that a CAM or TCAM query will begin and a parameter indicating an execution mode of the CAM or TCAM query.

12. The memory block circuits of claim 11, further comprising a second register comprising one or more circuits configured to store a set of one or more mask bits, wherein the comparator logic circuit is further configured to generate the set of one or more output bits based upon comparing the mask bits, the one or more pattern bits, and the one or more data bits read from the at least one memory.

13. The memory block circuits of claim 11, wherein the type of query is selected from a CAM-type query or a TCAM-type query.

14. A method for emulating CAM and TCAM query functionality using memory control circuits of an emulation system configured to execute read and write commands associated with memories of the emulation system, the method comprising:
   upon a memory control circuit receiving a query instruction indicating one or more memory addresses of one or more memories of the memory control circuit, a set of pattern bits modeling a query, and a query-type indicator:
      transmitting, by the memory control circuit, a special read instruction signal to the one or more memories, wherein the special read instruction comprises a query-type instruction, an indication that a CAM or TCAM query will begin, and a parameter indicating an execution mode of the CAM or TCAM query;
      storing, by the memory control circuit, the set of pattern bits into a first register of the memory control circuit, wherein the first register is coupled to a comparator circuit of the memory control circuit;
      transmitting, by the memory control circuit, into the comparator circuit a set of data bits stored in at least one memory of the one or more memories at the one or more addresses; and
      generating, by the comparator circuit of the memory control circuit, a set of one or more output bits based upon comparing the set of data bits from the memory addresses against the set of pattern bits in accordance with the query-type indicator.

15. The method according to claim 14, wherein the query-type indicator instructs the comparator circuit of the memory controller to execute a CAM-type query.

16. The method according to claim 14, wherein the query-type indicator instructs the comparator circuit of the memory controller to execute a TCAM-type query.

17. The method according to claim 14, further comprising:
   storing, by the memory control circuit, a set of mask bits into a second register of the memory control circuit coupled to the comparator circuit, upon the memory control circuit receiving the query instruction,
   wherein the query read instruction further comprises the set of mask bits, and
   wherein the comparator circuit is further configured to generate the set of one or more output bits based upon comparing the set of data bits from the memory addresses against the set of mask bits and the set of pattern bits, in accordance with the query-type indicator.

18. The method according to claim 14, further comprising:
   receiving, by a state machine circuit of the memory control circuit, the query instruction from at least one external circuit of the emulation system via a data signal bus coupling the memory control circuit to one or more external circuits of the emulation system external to the memory control circuit; and
   transmitting, by the state machine circuit, the set of pattern bits to the first register of the memory control circuit; and
   transmitting, by the state machine circuit, a special read instruction to the one or more memories indicating the one or more addresses of the at least one address to read into the comparator logic circuit.

19. The method according to claim 18, wherein the data signal bus is an emulation bus configured to communicate data signals containing data values generated by one or more emulation processors of the emulation system, and
   wherein the state machine circuit receives the query instruction via the emulation bus from the at least one external circuit.

20. The method according to claim 18, wherein the data signal bus in a system bus configured to communicate control signals containing operational instructions one or more circuits of the emulation system, and
   wherein the state machine circuit receives the query instruction via the system bus from the at least one external circuit.

* * * * *